United States Patent [19]

Maehara et al.

[11] Patent Number: 5,870,448
[45] Date of Patent: Feb. 9, 1999

[54] X-RAY MASK AND FABRICATION PROCESS USING IT

[75] Inventors: Hiroshi Maehara, Yokohama; Keiko Chiba, Utsunomiya, both of Japan

[73] Assignee: Canon Kabushiki Kaisha, Tokyo, Japan

[21] Appl. No.: 855,473

[22] Filed: May 13, 1997

[30] Foreign Application Priority Data

May 14, 1996 [JP] Japan .................................. 8-118914

[51] Int. Cl.$^6$ ...................................................... G21K 5/00
[52] U.S. Cl. ................................ 378/35; 430/5; 378/210
[58] Field of Search ..................... 378/35; 430/5

[56] References Cited

U.S. PATENT DOCUMENTS

| | | | |
|---|---|---|---|
| 4,735,877 | 4/1988 | Kato et al. ................................. | 430/5 |
| 5,375,157 | 12/1994 | Maehara .................................... | 378/35 |
| 5,422,921 | 6/1995 | Chiba ........................................ | 378/34 |
| 5,469,489 | 11/1995 | Miyake et al. ............................. | 378/35 |
| 5,485,495 | 1/1996 | Miyachi et al. ........................... | 378/34 |
| 5,553,110 | 9/1996 | Sentoku et al. ........................... | 378/35 |
| 5,593,800 | 1/1997 | Fujioka et al. ............................ | 430/5 |

FOREIGN PATENT DOCUMENTS 7-70466   7/1995   Japan .

*Primary Examiner*—Craig E. Church
*Attorney, Agent, or Firm*—Fitzpatrick, Cella, Harper & Scinto

[57] ABSTRACT

The present X-ray mask comprises an X-ray transmitting film, and a mask pattern formed on the X-ray transmitting film, wherein the mask pattern includes a mixture of a high-contrast pattern and a low-contrast pattern against X-rays and wherein the high-contrast pattern is comprised of stacked films the number of which is larger than that of the low-contrast pattern and which are made of different kinds of materials. A fabrication process of this X-ray mask comprises a step of forming a first metal film; a step of forming a second metal film of a different kind of material from the first metal film, thereon; and a step of successively performing a resist application process and an etching process to form a portion where the both first and second metal films are removed, a portion where only the first metal layer is left, and a portion where the both first and second metal layers are left, thereby forming a mask pattern.

6 Claims, 4 Drawing Sheets

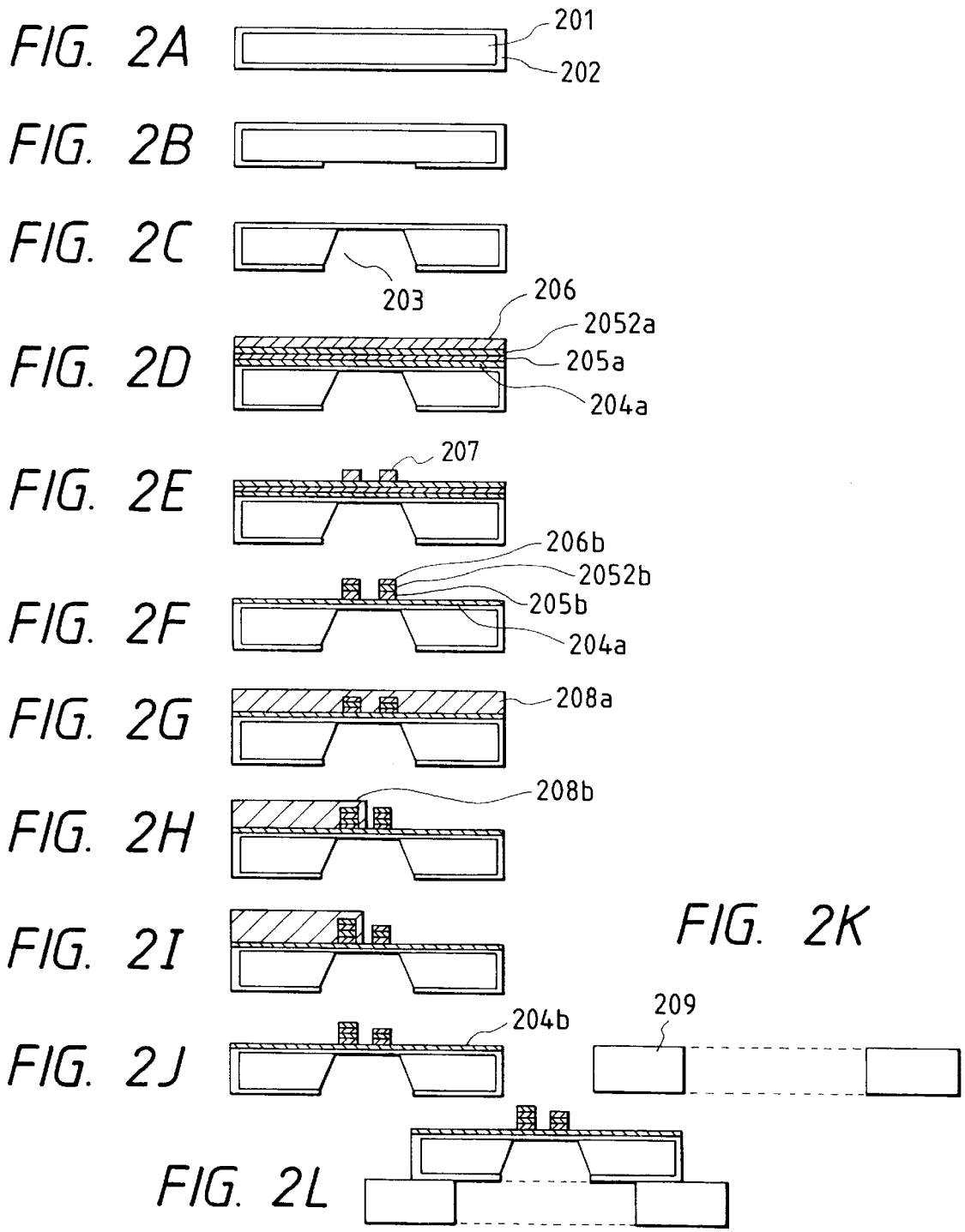

X-RAY MASK AND FABRICATION PROCESS USING IT

BACKGROUND OF THE INVENTION

1. Field of the Invention

The present invention relates to a mask for X-ray exposure and a fabrication process of this mask and, more particularly, to a mask structure for X-ray exposure capable of high-accuracy exposure transcription in X-ray lithography for transferring an electronic circuit pattern on a mask surface onto a wafer surface with use of X-rays, for example, in the wavelength range of approximately 2 to 150 Å and thereby fabricating semiconductor devices such as ICs or LSIs, micromachines, microoptics, and so on.

2. Related Background Art

In recent years pattern line widths of integrated circuits tend to decrease with increase in density and speed of semiconductor integrated circuit and it is said that they were reduced approximately 70% for three years These large-capacity memory elements are transcribed from a mask to a semiconductor substrate, using light in the region of from the near-ultraviolet light to the far-ultraviolet light, but the processing line widths of semiconductor device that can be processed with the light in these wavelength regions are approaching the limitation. Also, a reduction in focal depth inevitably occurs with a decrease in the exposure wavelength or with an increase in the numerical aperture of projection optical system Thus, exposure apparatus utilizing X-rays capable of higher-resolution printing are proposed with an increase in integration of semiconductor device. This X-ray lithography technology is highly expected as one capable of solving the issues of resolution and focal depth described above at the same time.

An X-ray mask used for above X-ray exposure normally has such structure that fine patterns of X-ray absorber and alignment patterns used for alignment are formed on an X-ray transmitting film made on an appropriate support frame such as a silicon wafer and that the support frame is further fixed on a mask frame of boro-silicate glass (e.g., Pyrex) or the like.

In carrying out patterning on an X-ray photoresist on the substrate with such an X-ray mask structure, appropriate exposure doses for attaining a resist pattern in the same size as that of a pattern on the mask differ depending upon the size of pattern. This means that the so-called mask size linearity is poor. In general, it is reported that low-contrast masks are advantageous to obtaining finer patterns. On the other hand, the transmittance of X-ray increases with decreasing mask contrast, which will cause such problems that a film reduction occurs in the resist pattern after development, that an undesired residual film appears after development, and so on, especially in the case of patterns of relatively large size. Because of this, It is described, for example in Japanese Patent Publication No. 7-70466, that the film thicknesses of X-ray absorber pattern are changed depending upon the pattern sizes. It was, however, not easy to process X-ray absorber patterns of the same material in different thicknesses and at high accuracy on the same plane in view of control accuracy of etch rate.

SUMMARY OF THE INVENTION

The present invention has been accomplished to solve the above problems of the conventional examples, and an object of the invention is to provide a mask for X-ray exposure that is easy to fabricate and that is contrast-controlled with accuracy. A further object of the invention is to provide an exposure apparatus and an exposure method using the X-ray mask, and a device fabrication process, and the like.

A preferred form of the X-ray mask according to the present invention for solving the above problems comprises an X-ray transmitting film, and a mask pattern formed on the X-ray transmitting film, wherein the mask pattern includes a mixture of a high-contrast pattern and a low-contrast pattern against X-rays and the high-contrast pattern is comprised of stacked films the number of which is larger than that of the low-contrast pattern and which are made of different kinds of materials.

Here, for example, the foregoing low-contrast pattern is one layer of a metal film and the foregoing high-contrast pattern is two layers of metal stacked films.

Preferably, an oxide film is formed at an interface between the stacked films.

A preferred form of the X-ray exposure apparatus according to the present invention comprises means for holding the X-ray mask of the above structure, and means for exposure-transcribing a mask pattern onto a wafer by irradiating the X-ray mask thus held, with X-rays A preferred form of the fabrication process of X-ray mask according to the present invention comprises a step of forming a first metal film; a step of forming a second metal film of a different kind of material from the first metal film, thereon; and a step of successively performing a resist application process and an etching process to form a portion where the both first and second metal films are removed, a portion where only the first metal layer is left, and a portion where the both first and second metal layers are left, thereby forming a mask pattern.

Further objects and preferred forms of the present invention will become apparent in the description of embodiments which follows.

BRIEF DESCRIPTION OF THE DRAWINGS

FIGS. 2A, 2B, 2C, 2D, 2E, 2F, 2G, 2H, 2I, 2J, 2K and 2L are drawings for explaining another example of steps in a fabrication process of an X-ray mask structure;

DETAILED DESCRIPTION OF THE PREFERRED EMBODIMENTS

Figure 1A:
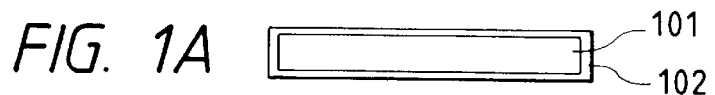
FIGS. 1A, 1B, 1C, 1D, 1E, 1F, 1G, 1H, 1I, 1J, 1K and 1L are drawings for explaining an example of steps in a fabrication process of an X-ray mask structure.
Figure 1B:
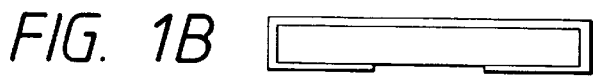
Figure 1C:
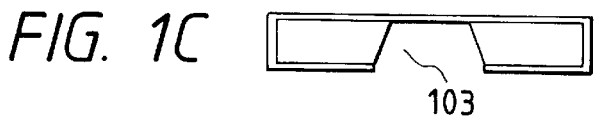

A fabrication process of the X-ray mask in the first embodiment of the present invention will be described with reference to FIGS. 1A to 1L. First prepared as a substrate for X-ray mask is one obtained by forming an X-ray transmitting film 102 on a silicon wafer 101 as shown in FIG. 1A. Then dry etching is carried out to remove a portion of the X-ray transmitting film on one side of the substrate corresponding to a: window 103 of X-ray mask (FIG. 1B). Next, the substrate is processed, for example, with an alkaline solution to form the window 103 shown in FIG. 1C. The silicon wafer with this window functions as a support frame. The X-ray transmitting film (membrane) is formed as a pattern support film on the substrate surface on the opposite side to the window 103.

Figure 1D:
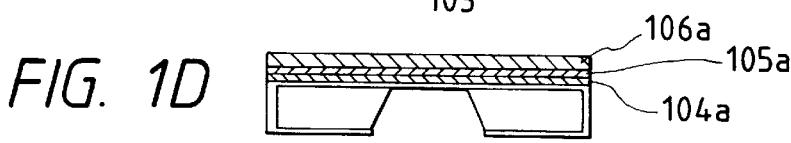

Then continuously formed on the X-ray transmitting film remaining as a self-supporting film (pattern support film), for example using a magnetron sputtering apparatus, are a film of appropriate metal, for example chromium, as an etching stop layer 104a of an absorber material, and subsequent films of first X-ray absorber material and second X-ray absorber material, thereby forming the etching stop layer 104a, first X-ray absorber film 105a, and second X-ray absorber film 106a (FIG. 1D). The X-ray absorber materials used herein may be selected from well-known materials. Specific examples of such materials include metals such as tungsten, tantalum, gold, and platinum.

The point of the present invention is that the materials of the first and second X-ray absorbers are different from each other.

Figure 1E:
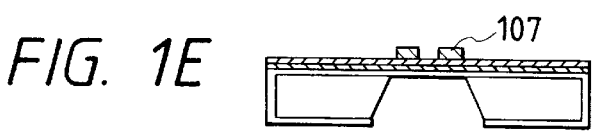

Then an electron beam resist, e.g. polymethylmethacrylate (PMMA), is applied onto the second X-ray absorber material, alignment patterns and a pattern for device are written on this resist by an electron beam lithography system, and it is then developed to form resist pattern 107 corresponding to X-ray absorber patterns (FIG. 1E).

Figure 1F:
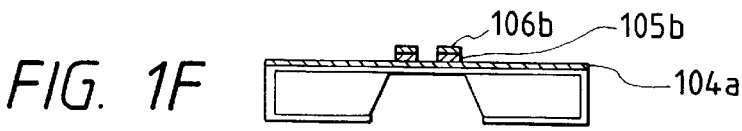

Then the process transfers to the etching step. First, using the resist pattern 107 as a mask, dry etching is carried out to etch the film of the second absorber material with a suitable gas and then to etch the film of the first absorber material with another suitable gas, and the upper-layer resist is subjected to ashing, for example, with $O_2$ plasma (FIG. 1F).

Figure 1G:
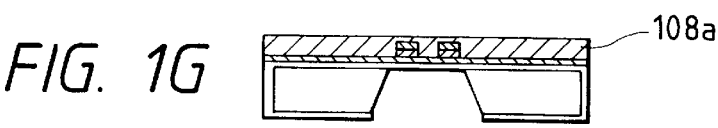
Figure 1H:
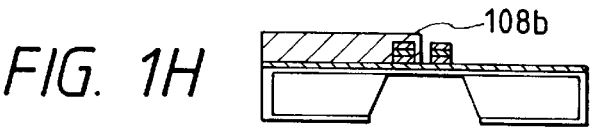
Figure 1I:
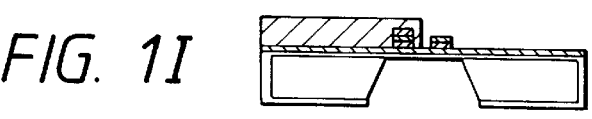
Figures 1J, 1K:
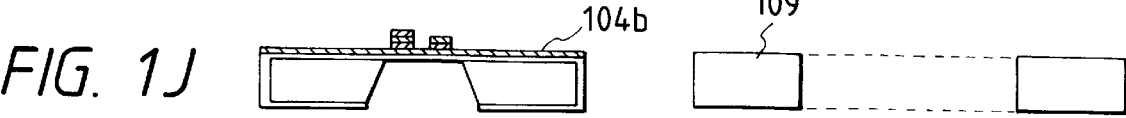
Figure 1L:
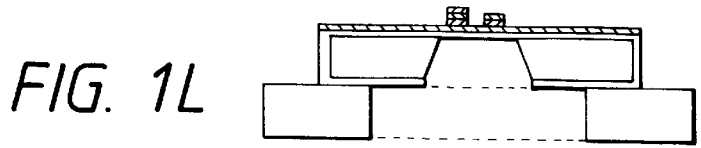

Then the resultant is again coated with a resist film 108a (FIG. 1G). Then exposure and development are carried out so as to remove only the resist in a portion expected to be a low-contrast pattern on the mask surface of the X-ray mask structure (FIG. 1E). Next, with the remaining resist film as a mask, etching is carried out to remove the second absorber film (FIG. 1I), and then the resultant is moved into a reactive ion etching (hereinafter abbreviated as RIE) system, in which $O_2$ RIE is carried out to effect removal of resist and oxidation of the aforementioned Cr film, thus forming a transparent chromium oxide film 104b (FIG. 1J). In this way the X-ray absorber patterns of different pattern thicknesses can be formed depending upon the patterns on the mask surface On the other hand, a mask frame 109 for reinforcing and fixing the X-ray mask structure is prepared (FIG. 1K). The mask frame has a hollowed shape in the thickness of about 2 mm to 10 mm, for example The hollow part has a shape of a circle, a square, a polygon, or the like including the pattern transcription region of X-ray mask. A desired material for the mask frame is one with as large Young's modulus as possible for securing the strength. It is also desired to have a coefficient of thermal expansion close to that of the silicon wafer bonded thereto. Specifically, applicable materials are metals such as stainless steel, glass materials such as borosilicate glass or silica, and ceramic materials such as silicon carbide and silicon nitride. The mask and the mask frame are positioned using coordinate-known marks on the mask and positioning marks on the mask frame and then they are bonded to each other with an appropriate adhesive, for example with an epoxy resin based adhesive or the like (FIG. 1L).

The X-ray mask structure thus fabricated has such a feature that the thicknesses of patterns in the exposure region are controlled at high accuracy depending upon the patterns, so that the line widths of the resist patterns transcribed onto the substrate being a body to be exposed to X-rays can be controlled at high accuracy.

Next described using FIGS. 2A to 2L is another fabrication process of the X-ray mask in the second embodiment of the present invention. First prepared as a substrate for X-ray mask is one obtained by forming an X-ray transmitting film 202 on a silicon wafer 201 as shown in FIG. 2A. Then dry etching is carried out to remove a portion of the X-ray transmitting film on one side of the substrate corresponding to a window 203 of X-ray mask (FIG. 2B). Next, the substrate is processed, for example, with an alkaline solution to form the window 203 shown in FIG. 2C. The silicon wafer with this window functions as a support frame. The X-ray transmitting film is formed as a support film on the substrate surface on the opposite side to the window 203.

Then continuously formed on the X-ray transmitting film remaining as a self-supporting film (pattern support film), for example using the magnetron sputtering apparatus, are a film of appropriate metal, for example chromium, as an etching stop layer 204a of absorber material and a subsequent layer of first X-ray absorber, for example tungsten, to form the first X-ray absorber film 205a. The procedures up to this point are the same as in the previous example described referring to FIGS. 1A to 1L.

Then the tungsten surface of the first X-ray absorber material is subjected to oxidation with $O_2$ plasma to form a tungsten oxide film 2052a in the tungsten surface layer. Then a second X-ray absorber material (206) is formed on the oxide film, for example using the magnetron sputtering apparatus (FIG. 2D).

The materials of X-ray absorbers used herein may be selected from well-known materials. Specifically, applicable materials are metals such as tungsten, tantalum, gold, and platinum, and preferred materials in this example are tungsten and tantalum as the materials of first X-ray absorber and second X-ray absorber, respectively. The point of the present invention is that the materials of first and second X-ray absorbers are different from each other.

Then an electron beam resist, e.g. PMMA, is applied onto the second X-ray absorber film, alignment patterns and a pattern for device are written on this resist by the electron beam lithography system, and then it is developed to form resist pattern 207 corresponding to X-ray absorber patterns (FIG. 2E).

Then the process proceeds to the etching step. First, dry etching is carried out to etch the film of the second absorber material with an appropriate gas, using the resist pattern 207 as a mask. Subsequently, the tungsten oxide film exposed is dissolved and removed with a dilute acid, e.g., with a dilute hydrochloric acid solution. Then the film of first absorber material is dry-etched using another suitable gas, and the upper-layer resist is subjected to ashing, for example, with $0_2$ plasma (FIG. 2F).

Then the resultant is again coated with a resist film 208a (FIG. 2G). Then exposure and development are carried out so as to remove only the resist in a portion expected to be a low-contrast pattern on the mask surface of the X-ray mask structure (FIG. 2H).

Next, with the remaining resist film as a mask, etching is carried out to remove the second absorber film (FIG. 2I), and then the resultant is moved into the RIE system, in which $0_2$ RIE is carried out to effect removal of resist and oxidation of the aforementioned Cr film, thus forming a transparent chromium oxide film 204b (FIG. 2J). In this way the X-ray absorber patterns of different pattern thicknesses, thus of different contrasts, can be formed depending upon the patterns on the mask surface.

On the other hand, a mask frame 209 for reinforcing and fixing the X-ray mask structure is prepared (FIG. 2K). Then the mask and the mask frame are positioned using coordinate-known marks on the mask and positioning marks on the mask frame and then they are bonded to each other with an appropriate adhesive, for example with an epoxy resin based adhesive or the like (FIG. 2L).

The X-ray mask structure thus fabricated has such a feature that the thicknesses of patterns in the exposure region are controlled at high accuracy depending upon the patterns, so that the line widths of the resist pattern's transcribed onto the substrate being a body to be exposed to X-rays can be controlled at high accuracy.

Summarizing the above, the first embodiment is the method for preliminarily forming the films of X-ray absorber materials in the multilayer structure of the plural materials of different etch rates depending upon thicknesses corresponding to the film thicknesses of the respective X-ray absorber patterns of mask to be aimed and for repetitively carrying out plural lithographies, thereby processing the films in the desired film thicknesses. Since in this method the film thickness of each pattern is determined by the initial film thickness of each material, no dispersion occurs in the film thickness of X-ray absorber pattern due to distribution of etch rate of dry etching apparatus. If an aimed X-ray mask structure has n types of film thicknesses, an aimed mask can be obtained using n types of X-ray absorber materials Such X-ray absorber materials may be selected from the well-known materials. Specific examples of such materials include tungsten, tantalum, gold, and platinum.

The second embodiment is the method for forming the oxide film of the absorber material in the interface layer of the X-ray absorber material in the first embodiment. This oxide film permits the etch selectivity over the upper-layer X-ray absorber film to be set higher, depending upon the absorber material.

Figure 3:
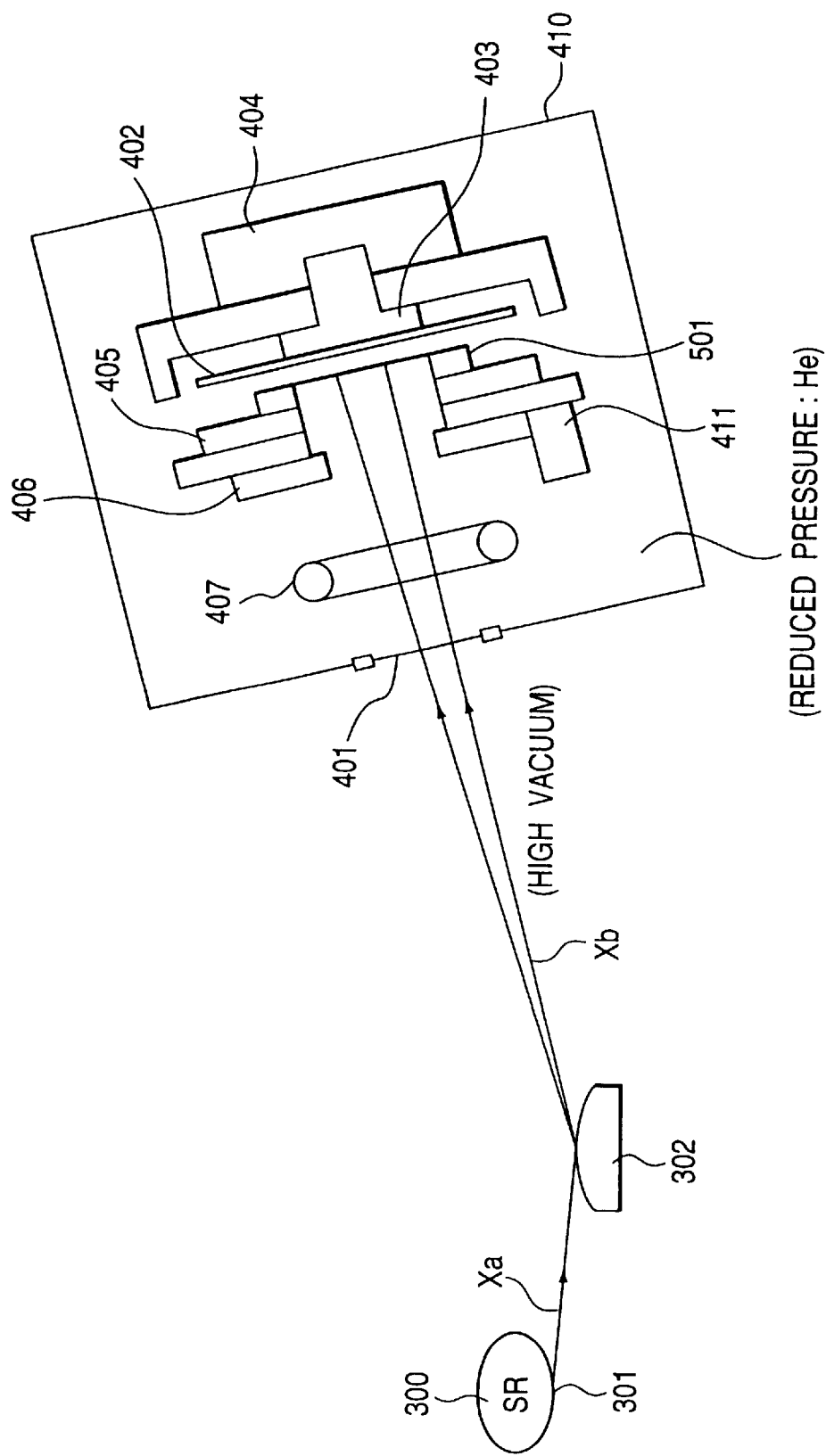
FIG. 3 is a drawing to show the structure of an X-ray exposure apparatus.

An exposure apparatus and an exposure method using the X-ray mask as described above will be described. FIG. 3 is a schematic drawing of the major part of the exposure apparatus.

In the same drawing reference numeral 300 designates an SR ring and 301 a radiative point of X-ray. X-rays X$a$ launched from the radiative point 301 are of a sheet beam shape in which the beam spreads horizontally with uniform intensity of light while the beam has little spread vertically. The X-rays X$a$ are reflected by a cylindrical mirror 302 to be expanded vertically, thereby forming the beam X$b$ of a nearly square cross section. This achieves a square exposure region.

Numeral 401 designates a thin film of Be for separating the exposure apparatus from the SR section 300 and the beam line section including the mirror. The SR 300 side of the thin film 401 is kept in a high vacuum and the exposure apparatus side is housed in a chamber 410. The inside of chamber 410 is in a reduced-pressure He ambience. Numeral 402 denotes a wafer as a body to be exposed. The wafer 402 is held by vacuum suction on a wafer chuck 403 The wafer chuck 403 is mounted. on a wafer stage 404. The wafer 402 is positioned by moving the wafer stage 404.

Numeral 501 represents the mask, which is adhered to a mask stage 405 to be held at the position opposed to the wafer 402. An alignment unit 406 has an optical system for detecting alignment marks for positioning of a circuit pattern on mask 501 and an exposure area on wafer 402, provided respectively on the mask 501 and on the wafer 402, and an arithmetic unit for calculating deviation between the mask 501 and the wafer 402. Numeral 411 denotes a pre-alignment unit.

Next described is the operation of the exposure apparatus. The sheet beam of X-rays X$a$ emitted from the SR 300 is changed via the cylindrical mirror 302 into the exposure beam X$b$. The exposure beam X$b$ has the uniform intensity of light horizontally but has an intensity distribution vertically. Exposure intensity correction is effected by shutter 407 in order to correct this intensity distribution, thereby obtaining uniform exposure dose throughout the entire exposure area.

The wafer 402 and mask 501 are loaded at respective exposure positions of the exposure apparatus by loading means not illustrated. After loaded, the wafer is adhered to the wafer chuck while the mask to the mask chuck. Then the alignment unit 406 moves to the position to detect the alignment mark on the mask 501 and then detects the mark on the mask 501. Then the wafer stage 404 moves, so that the alignment mark on the wafer 402 comes to a position where the alignment mark on the wafer 402 overlaps with that on the mask 501.

The alignment unit 406 detects the mark on the mask 501 and the alignment mark on the wafer 402 and calculates a deviation amount between them in the arithmetic unit. The wafer stage 404 is moved so as to make the obtained deviation amount equal to 0, thereby positioning the wafer 402 with respect to the circuit pattern on the mask 501. After positioning of them, the shutter 407 operates to effect exposure. Then the wafer 402 is subjected to the well-known development step, thereby fabricating the semiconductor device.

Next described is a fabrication process of semiconductor device (semiconductor element) utilizing the exposure apparatus described above.

Figure 4:
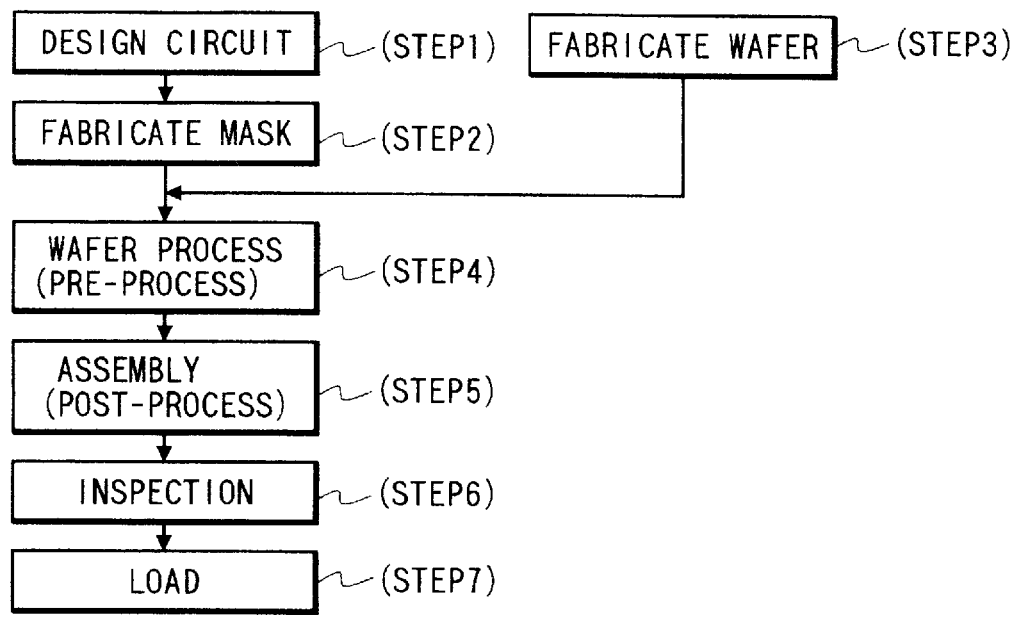
FIG. 4 is a drawing to show a fabrication flow of semiconductor device.

FIG. 4 is a flowchart of fabrication of semiconductor device (semiconductor chip such as IC or LSI, liquid crystal panel, CCD, or the like). In this example step 1 (circuit design) is for designing a circuit of semiconductor device. Step 2 (mask fabrication) is for fabricating a mask in which the circuit pattern is formed. On the other hand, a wafer is fabricated using the material such as silicon at step 3 (wafer fabrication). Step 4 (wafer process) is called a pre-process, in which an actual circuit is formed on the wafer by the lithography technology using the prepared mask and wafer.

The completed X-ray mask of the present invention is loaded in the exposure apparatus. When the mask is conveyed and chucked by the mask chuck, the pattern is in a fixed area relative to the apparatus. Therefore, the alignment unit shows no error between the mask and alignment unit without performing search operation for the pattern on the mask.

Then the wafer is loaded to be opposed to the mask. The alignment unit detects deviation between the wafer and the mask. The wafer stage is driven to make positioning of them. After alignment is achieved between them, exposure is carried out. After completion of exposure, the wafer is stepped to a next shot and the operation of alignment and below is carried out. This method is featured by an improvement in throughput, because it does. not perform the search operation of the alignment unit when the mask is loaded.

Next step 5 (assembly) is called a post-process, which is a process for forming semiconductor chips from the wafer fabricated at step 4, including steps such as an assembly step (dicing, bonding), a packaging step (encapsulation of chip), etc.

Step 6 (inspection) is for carrying out tests including the operation check test, durability test, and the like of semiconductor devices fabricated at step 5. The semiconductor devices are completed through these steps and they are shipped (at step 7).

Figure 5:
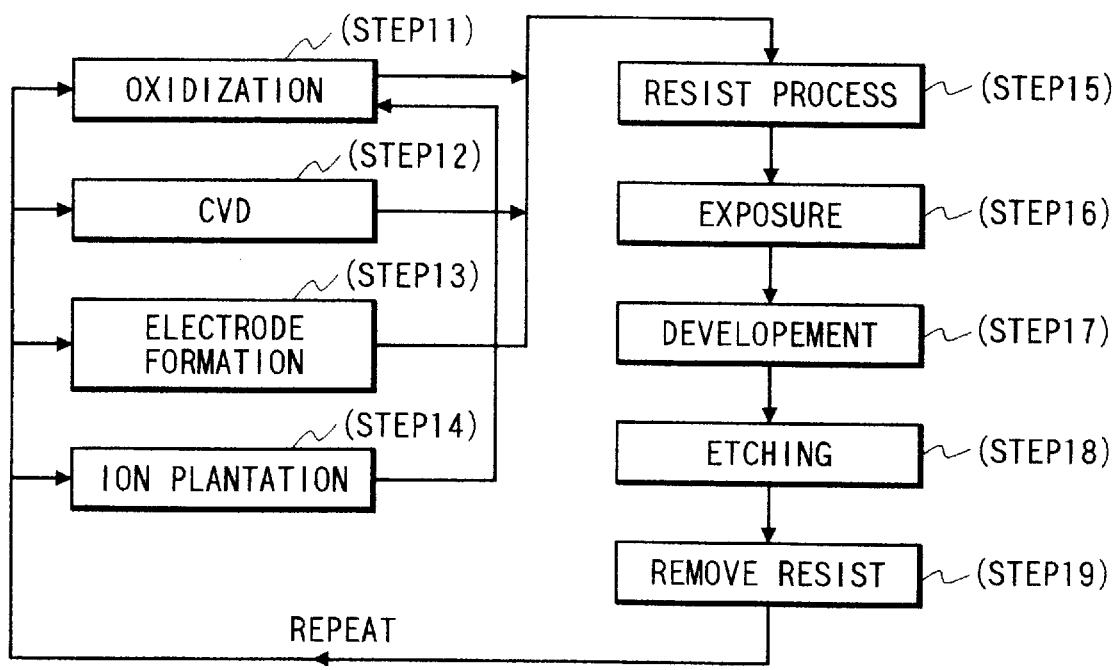
FIG. 5 is a drawing to show the detailed flow of wafer process.

FIG. 5 is a detailed flowchart of the wafer process of above step 4. First, the surface of wafer is oxidized at step 11 (oxidation). At step 12 (CVD) an insulating film is formed on the wafer surface. At step 13 (formation of electrode) electrodes are formed on the wafer by evaporation. At step 14 (ion implantation) ions are implanted into the wafer. At step 15 (resist process) a photosensitive agent is applied onto the wafer. At step 16 (exposure) the circuit pattern on the mask is printed by exposure onto the wafer by the exposure apparatus described above. At step 17 (development) the exposed wafer is developed. At step 18 (etching) portions other than the developed resist are removed. Multiple circuit patterns are formed on the wafer by repetitively carrying out these steps.

What is claimed is:

1. An X-ray mask comprising:

an X-ray transmitting film; and a mask pattern formed on the X-ray transmitting film, wherein said mask pattern includes a mixture of a high-contrast pattern and a low-contrast pattern against X-rays and said high-contrast pattern is comprised of stacked films the number of which is larger than that of the low-contrast pattern and which are made of different kinds of materials.

2. The X-ray mask according to claim 1, wherein said low-contrast pattern is one layer of a metal film and said high-contrast pattern is two layers of metal stacked films.

3. The X-ray mask according to claim 1, wherein an oxide film is formed at an interface between said stacked films.

4. An X-ray exposure apparatus comprising:

means for holding the X-ray mask as set forth in claim 1; and means for exposure-transcribing a mask pattern onto a wafer by irradiating the X-ray mask thus held, with X-rays.

5. A fabrication process of X-ray mask comprising:

a step of forming a first metal film;

a step of forming a second metal film of a different kind of material from said first metal film, thereon; and a step of successively performing a resist application process and an etching process to form a portion where the both first and second metal films are removed, a portion where only the first metal layer is left, and a portion where the both first and second metal layers are left, thereby forming a mask pattern.

6. The process according to claim 5, wherein an oxide film is formed at an interface between said first metal film and said second metal film.

* * * * *

UNITED STATES PATENT AND TRADEMARK OFFICE
CERTIFICATE OF CORRECTION

PATENT NO. : 5,870,448        Page 1 of 8
DATED : February 9, 1999
INVENTOR(S) : HIROSHI MAEHARA, ET AL.

It is certified that error appears in the above-identified patent and that said Letters Patent is hereby corrected as shown below:

ON THE COVER PAGE:

Under item [57] "ABSTRACT", replace the present abstract with the following:

--An X-ray transmitting film, and a mask pattern formed on the X-ray transmitting film, wherein the mask pattern includes a mixture of a high-contrast pattern and a low-contrast pattern against X-rays. The high-contrast pattern is comprised of stacked films, the number of which is larger than that of the low-contrast pattern and which are made of different kinds of materials. A process for fabricating an X-ray mask includes forming a first metal film, forming a second metal film of a different kind of material from the first metal film, thereon, and successively performing a resist application process and an etching process to form a portion where both of the first and second metal films are removed, a portion where only the first metal layer is left, and a portion where both of the first and second metal layers are left, thereby forming a mask pattern.--.

UNITED STATES PATENT AND TRADEMARK OFFICE
CERTIFICATE OF CORRECTION

PATENT NO. : 5,870,448
DATED : February 9, 1999
INVENTOR(S) : HIROSHI MAEHARA, ET AL.

It is certified that error appears in the above-identified patent and that said Letters Patent is hereby corrected as shown below:

COLUMN 1:

line 11, "with" should read --with the--;
    line 17, "years" should read --years,--;
    line 18, "with" should read --with an--;
    line 19, "circuit" should read --circuits--;
    line 23, "the" (first and second occurrences) should be deleted;
    line 24, "line widths" should read --linewidths-- and "device" should read --devices--;
    line 26, "the" should read --their--;
    line 28, "of" should read --of a--;
    line 29, "system" should read --system.--;
    line 31, "device." should read --devices.--;
    line 35, "above" should read --the above--;
    line 36, "such" should read --such a--;
    line 46, "pattern." should read --the pattern.--;
    line 49, "X-ray increases" should read --X-rays increase--;
    line 55, "example" should read --example,--;
    line 56, "pattern" should read --patterns--; and
    line 60, "control" should read --the control-- and "etch" should read --an etch--.

UNITED STATES PATENT AND TRADEMARK OFFICE
CERTIFICATE OF CORRECTION

| | | |
|---|---|---|
| PATENT NO. : | 5,870,448 | Page 3 of 8 |
| DATED : | February 9, 1999 | |
| INVENTOR(S) : | HIROSHI MAEHARA, ET AL. | |

It is certified that error appears in the above-identified patent and that said Letters Patent is hereby corrected as shown below:

COLUMN 2:

line 30, "the both" should read --both the--;
    line 32, "the both" should read --both the--;
    line 49, "semiconductor" should read --a semiconductor--;
    line 50, "wafer" should read --a wafer--;
    line 59, "X-ray" should read --an X-ray--;
    line 61, "Then" should read --Then,--; and
    line 63, "a:" should read --a-- and "X-ray" should read --an X-ray--.

COLUMN 3:

line 3, "Then" should read --Then,--;
    line 5, "example" should read --example,--;
    line 6, "example" should read --example,--;
    line 8, "first" should read --a first-- and "second" should read --a second--;
    line 17, "Then" should read --Then,-- and "e.g." should read --e.g.,--;
    line 19, "device" should read --a device--;
    line 21, "resist" should read --a resist--;
    line 23, "Then" should read --Then,--;
    line 30, "Then" should read --Then,--;
    line 31, "Then" should read --Then,--;

UNITED STATES PATENT AND TRADEMARK OFFICE
CERTIFICATE OF CORRECTION

PATENT NO. : 5,870,448
DATED : February 9, 1999
INVENTOR(S) : HIROSHI MAEHARA, ET AL.

It is certified that error appears in the above-identified patent and that said Letters Patent is hereby corrected as shown below:

COLUMN 3:

line 34, "(FIG. 1E)." should read --(FIG. 1H).--;
    line 36, "then" should read --then,--;
    line 38, "resist" should read --the resist--;
    line 40, "way" should read --way,--;
    line 49, "X-ray" should read --an X-ray--;
    line 50, "Young's" should read --a Young's--;
    line 60, "example" should read --example,--; and
    line 65, "line widths" should read --linewidths--.

COLUMN 4:

line 3, "X-ray" should read --an X-ray--;
    line 5, "Then" should read --Then,--;
    line 8, "X-ray" should read --an X-ray--;
    line 13, "Then" should read --Then,--;
    line 15, "example" should read --example,-- and "the" should read --a--;
    line 16, "appropriate" should read --an appropriate-- and "example" should read --example,--;
    line 17, "absorber" should read --an absorber--;
    line 18, "first" should read --a first-- and "example" should read --example,--;
    line 22, "Then" should read --Then,--;

UNITED STATES PATENT AND TRADEMARK OFFICE
CERTIFICATE OF CORRECTION

PATENT NO. : 5,870,448
DATED : February 9, 1999
INVENTOR(S) : HIROSHI MAEHARA, ET AL.

It is certified that error appears in the above-identified patent and that said Letters Patent is hereby corrected as shown below:

COLUMN 4:

line 25, "Then" should read --Then,--;
    line 26, "example" should read --example,--;
    line 32, "first" should read --the first--;
    line 34, "first" should read --the first--;
    line 36, "Then" should read --Then,--;
    line 38, "device" should read --a device--;
    line 39, "then" should read --then,--;
    line 42, "Then" should read --Then,--;
    line 48, "Then" should read --Then,-- and "first" should read --the first--;
    line 52, "Then" should read --Then,--;
    line 53, "Then" should read --Then,--;
    line 59, "then" should read --then,--;
    line 60, "resist" should read --the resist--;
    line 62, "way" should read --way,--; and
    line 67, "Then" should read --Then,--.

COLUMN 5:

line 4, "example" should read "example,";
    line 9, "line widths" should read --linewidths-- and "pattern's" should read --patterns--;
    line 12, "the" (third occurrence) should read --a--;

UNITED STATES PATENT AND TRADEMARK OFFICE
CERTIFICATE OF CORRECTION

| | | |
|---|---|---|
| PATENT NO. : | 5,870,448 | Page 6 of 8 |
| DATED : | February 9, 1999 | |
| INVENTOR(S) : | HIROSHI MAEHARA, ET AL. | |

It is certified that error appears in the above-identified patent and that said Letters Patent is hereby corrected as shown below:

COLUMN 5:

line 17, "mask" should read --a mask--;
    line 22, "X-ray" should read --the X-ray-- and "to" should read --to a--;
    line 23, "etch" should read --an etch-- and "dry" should read --a dry--;
    line 25, "materials" should read --materials.--;
    line 29, "the method" should read --a method--;
    line 40, "drawing" should read --drawing,-- and "X-ray." should read --X-rays.--;
    line 43, "uniform" should read --a uniform--; and
    line 56, "chuck 403" should read --chuck 403.--.

COLUMN 6:

line 8, "uniform" should read --a uniform--;
    line 12, "loaded," should read --being loaded,--;
    line 13, "mask" (first occurrence) should read --mask is adhered-- and "Then" should read --Then,--;
    line 16, "Then" should read --Then,--;
    line 27, "Then" should read --Then,--;
    line 30, "of" should read --of a--;
    line 34, "(semiconductor" should read --(e.g., a semiconductor--, "IC" should read --an IC-- and "LSI, liquid" should read --an LSI, a liquid--;

UNITED STATES PATENT AND TRADEMARK OFFICE
CERTIFICATE OF CORRECTION

PATENT NO. : 5,870,448

DATED : February 9, 1999

INVENTOR(S) : HIROSHI MAEHARA, ET AL.

It is certified that error appears in the above-identified patent and that said Letters Patent is hereby corrected as shown below:

COLUMN 6:

line 35, "CCD," should read --a CCD,-- and "example" should read --example,--;
    line 36, "of" should read --of a--;
    line 47, "and" should read --and the--;
    line 50, "Then" should read --Then,--;
    line 51, "deviation" should read --a deviation--;
    line 53, "to make" should read --for--; and
    line 60, "Next" should read --Next,--.

COLUMN 7:

line 4, "above" should read --the above-- and "wafer" should read --the wafer--;
    line 5, "(CVD)" should read --(CVD),--;
    line 7, "electrode)" should read --electrode),--;
    line 8, "implantation)" should read --implantation),--;
    line 9, "process)" should read --process),--;
    line 10, "(exposure)" should read --(exposure),--;
    line 13, "(development)" should read --(development),--; and
    line 14, "(etching)" should read --(etching),--.

UNITED STATES PATENT AND TRADEMARK OFFICE
CERTIFICATE OF CORRECTION

PATENT NO. : 5,870,448
DATED : February 9, 1999
INVENTOR(S) : HIROSHI MAEHARA, ET AL.

It is certified that error appears in the above-identified patent and that said Letters Patent is hereby corrected as shown below:

COLUMN 8:

line 12, "X-ray" should read --an X-ray--;
    line 18, "the both" should read --both the--; and
    line 20, "the both" should read --both the--.

Signed and Sealed this

Sixteenth Day of November, 1999

Attest:

Q. TODD DICKINSON

*Attesting Officer*    *Acting Commissioner of Patents and Trademarks*